US008629445B2

(12) United States Patent
Tanaka et al.

(10) Patent No.: US 8,629,445 B2
(45) Date of Patent: Jan. 14, 2014

(54) SEMICONDUCTOR DEVICE, MANUFACTURING METHOD THEREOF, AND ELECTRONIC APPLIANCE

(75) Inventors: Tetsuhiro Tanaka, Kanagawa (JP); Ryo Tokumaru, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/397,705

(22) Filed: Feb. 16, 2012

(65) Prior Publication Data

US 2012/0211809 A1 Aug. 23, 2012

(30) Foreign Application Priority Data

Feb. 21, 2011 (JP) ................................. 2011-034295

(51) Int. Cl.
| H01L 29/04 | (2006.01) |
| H01L 29/10 | (2006.01) |
| H01L 31/00 | (2006.01) |
| H01L 21/00 | (2006.01) |
| H01L 21/84 | (2006.01) |

(52) U.S. Cl.
USPC .................. 257/61; 257/52; 257/57; 257/59; 257/E31.034; 257/E31.039; 257/E31.046; 438/158; 438/159

(58) Field of Classification Search
USPC ........ 257/16, 19, 52, 57, 59, 61, 63, E31.034, 257/E31.046, E31.049; 438/158–159
See application file for complete search history.

(56) References Cited

U.S. PATENT DOCUMENTS

| 4,778,773 | A | * | 10/1988 | Sukegawa ...................... 438/160 |
| 5,294,811 | A | * | 3/1994 | Aoyama et al. .................. 257/59 |
| 5,825,050 | A | * | 10/1998 | Hirakawa ......................... 257/57 |
| 7,738,050 | B2 | | 6/2010 | Yamazaki et al. |
| 7,741,687 | B2 | | 6/2010 | Yamaguchi et al. |
| 7,767,516 | B2 | | 8/2010 | Aoki et al. |
| 8,343,858 | B2 | | 1/2013 | Tanaka et al. |
| 8,421,083 | B2 | | 4/2013 | Yamazaki et al. |
| 2009/0001375 | A1 | | 1/2009 | Yamazaki et al. |
| 2009/0002590 | A1 | | 1/2009 | Kimura |
| 2009/0002591 | A1 | | 1/2009 | Yamazaki et al. |
| 2009/0008645 | A1 | | 1/2009 | Yamazaki et al. |
| 2009/0047760 | A1 | * | 2/2009 | Yamazaki et al. ............ 438/158 |
| 2009/0166631 | A1 | * | 7/2009 | Yamazaki ........................ 257/57 |
| 2009/0294769 | A1 | * | 12/2009 | Irizumi ........................... 257/57 |
| 2009/0321737 | A1 | | 12/2009 | Isa et al. |
| 2009/0321743 | A1 | | 12/2009 | Isa et al. |
| 2010/0148178 | A1 | | 6/2010 | Godo et al. |

FOREIGN PATENT DOCUMENTS

| JP | 4-125971 | 4/1992 |
| JP | 6-045357 | 2/1994 |
| JP | 2007-035964 | 2/2007 |
| JP | 2010-161358 | 7/2010 |

* cited by examiner

*Primary Examiner* — Cheung Lee
*Assistant Examiner* — Jeremy Joy
(74) *Attorney, Agent, or Firm* — Nixon Peabody LLP; Jeffrey L. Costellia

(57) ABSTRACT

Provided are a semiconductor device with less leakage current is reduced, a semiconductor device with both of high field effect mobility and low leakage current, an electronic appliance with low power consumption, and a manufacturing method of a semiconductor device in which leakage current can be reduced without an increase in the number of masks. The side surface of a semiconductor layer formed of a semiconductor film having high carrier mobility is not in contact with any of a source electrode and a drain electrode. Further, such a transistor structure is formed without an increase in the number of photomasks and can be applied to an electronic appliance.

15 Claims, 8 Drawing Sheets

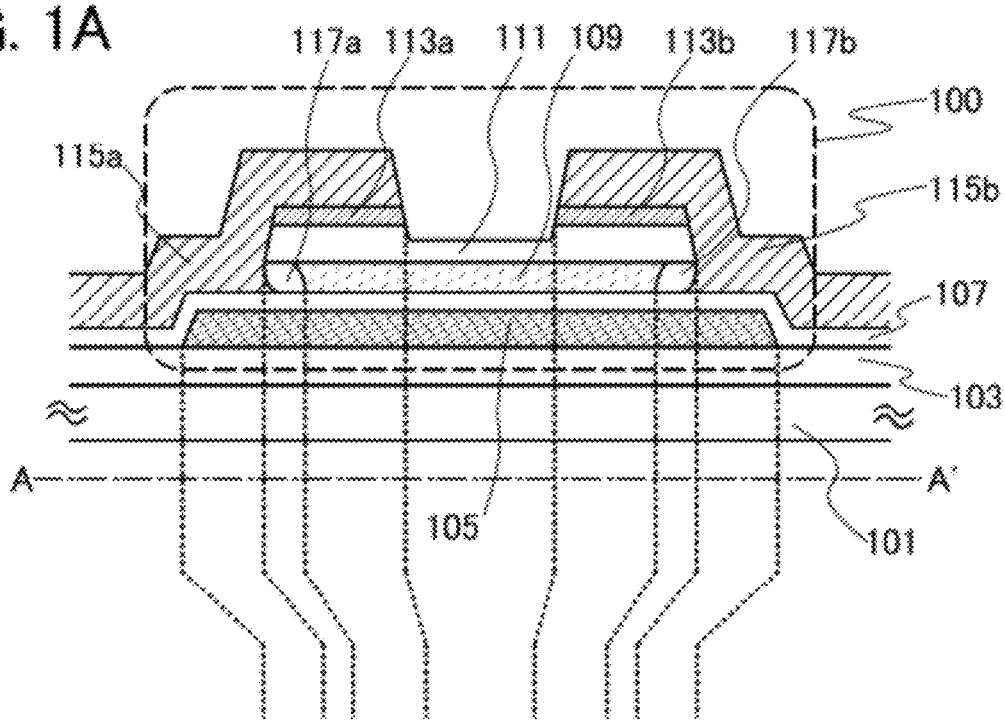
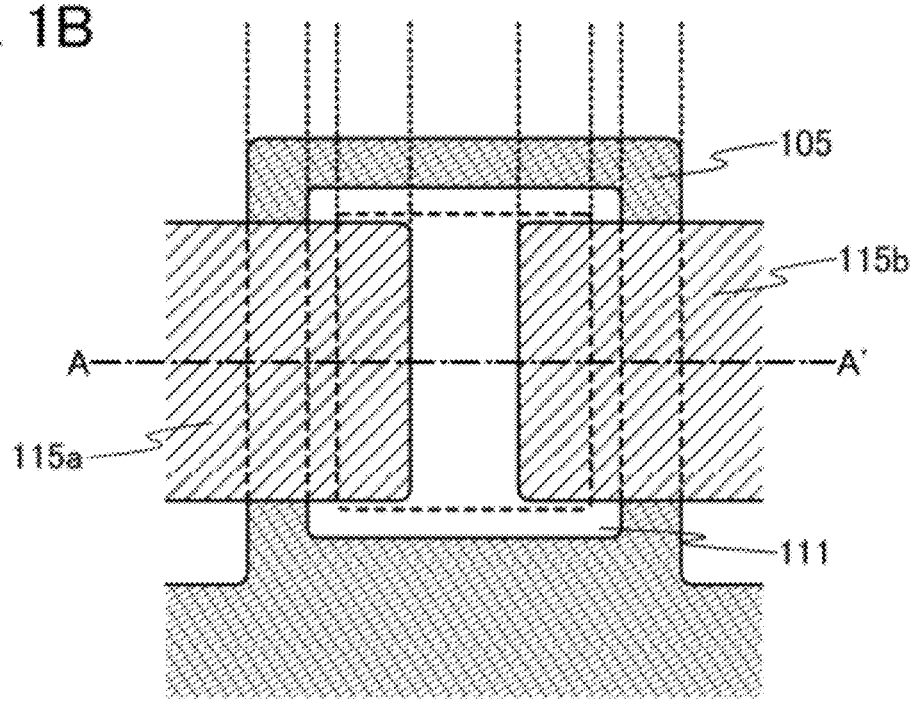

SEMICONDUCTOR DEVICE, MANUFACTURING METHOD THEREOF, AND ELECTRONIC APPLIANCE

BACKGROUND OF THE INVENTION

1. Field of the Invention

The present invention relates to a semiconductor device and a manufacturing method thereof. The present invention relates to an electronic appliance.

2. Description of the Related Art

In recent years, a technique by which a semiconductor device such as a thin film transistor (also referred to as a TFT) is formed using a semiconductor thin film (having a thickness of approximately several tens of nanometers to several hundreds of nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being demanded.

Moreover, there is a trend in an image display device typified by a liquid crystal display device toward a larger screen, e.g., a 60-inch diagonal screen, and further, the development of an image display device has proceeded toward a screen size of a diagonal of 120 inches or more. In addition, a trend in resolution of a screen is toward higher definition, e.g., high-definition (HD) image quality (1366×768) or full high-definition (FHD) image quality (1920×1080), and prompt development of a so-called 4K Digital Cinema display device, which has a resolution of 3840×2048 or 4096×2180, is also demanded. Conventionally, for such a large-sized image display device, a thin film transistor using amorphous silicon has been used as a switching element.

On the other hand, a liquid crystal display device in which the drive frequency is increased in order to improve the display performance of a moving image, a 3D image is displayed, or the like has also been developed. In such a display device, it is difficult to display high-definition moving images in the case of using a thin film transistor using conventional amorphous silicon; therefore, a thin film transistor which responds at high speed and has high field effect mobility is needed and prompt development of a semiconductor device using a semiconductor film with high carrier mobility is demanded. For example, as a semiconductor film with high carrier mobility, which is suitable for manufacturing a large-sized substrate, a thin film transistor using a microcrystalline silicon film is known (Patent Document 1).

FIG. 8 illustrates a structure of the thin film transistor described in Patent Document 1. The thin film transistor includes a gate electrode layer 205, a gate insulating layer 207, a first semiconductor layer 209, a second semiconductor layer 211, impurity semiconductor layers 213a and 213b, a source electrode layer 215a, and a drain electrode layer 215b over a substrate 101. Note that the source electrode layer 215a and the drain electrode layer 215b of the thin film transistor are formed in contact with each side surface of the first semiconductor layer 209 and the second semiconductor layer 211.

By the way, when a thin film transistor is manufactured over a substrate having an insulating surface, as the number of masks used in a photolithography method is decreased, the number of manufacturing steps can be reduced, which leads to cost reduction in manufacturing the thin film transistor.

REFERENCE

[Patent Document 1] Japanese Published Patent Application No. 2010-161358

SUMMARY OF THE INVENTION

Further, in the case where a semiconductor film having high carrier mobility such as a microcrystalline silicon film is applied to a thin film transistor, there has been a problem in that leakage current (source-drain current, also referred to as off-leakage current) where the transistor is off is high.

The present invention is made in view of the foregoing technical background. Therefore, it is an object of one embodiment of the present invention to provide a semiconductor device in which leakage current is reduced.

Further, it is an object of one embodiment of the present invention to provide a semiconductor device in which both of high field effect mobility and low leakage current are realized.

Furthermore, it is an object of one embodiment of the present invention to provide an electronic appliance with low power consumption.

In addition, it is an object of one embodiment of the present invention to provide a manufacturing method of a semiconductor device in which leakage current can be reduced without an increase in the number of masks.

The present invention achieves at least one of the above-described objects.

In order to achieve any of the above-described objects in the present invention, the path of leakage current in a thin film transistor is considered. In particular, when the side surface of an island-shaped semiconductor layer for forming a channel is in contact with a source electrode and a drain electrode of the transistor, current flows between the source and the drain through the semiconductor film.

Therefore, in order to solve the above problem, it is preferable to employ, a structure in which the side surface (also referred to as the end portion) of a semiconductor layer formed of a semiconductor film having high carrier mobility is not in contact with a source electrode and a drain electrode. Further, it is preferable that a transistor having such a transistor structure be formed without an increase in the number of photomasks.

That is, a semiconductor device according to one embodiment of the present invention includes a gate electrode layer and a first semiconductor layer over an insulating surface; a second semiconductor layer provided in contact with the first semiconductor layer; a gate insulating layer provided between the gate electrode layer and the first semiconductor layer; a first impurity semiconductor layer and a second impurity semiconductor layer provided in contact with the second semiconductor layer so as to be separated from each other; a first conductive layer electrically connected to the first impurity semiconductor layer; and a second conductive layer electrically connected to the second impurity semiconductor layer. Further, the end portion of the first semiconductor layer is positioned inside the second semiconductor layer so that the first semiconductor layer is not in contact with any of the first conductive layer and the second conductive layer.

According to one embodiment of the present invention, the side surface (the end portion) of the first semiconductor layer for forming a channel is not in contact with any of the source electrode and the drain electrode; therefore, leakage current that flows through the first semiconductor layer in an off state is suppressed, so that a semiconductor device having less leakage current can be obtained.

Further, a semiconductor device according to one embodiment of the present invention has a space between the end portion of the first semiconductor layer and the first conductive layer and a space between the end portion of the first semiconductor layer and the second conductive layer in the above semiconductor device.

A space can be provided between the side surface (the end portion) of the first semiconductor layer and the source electrode and a space can be provided between the side surface of the first semiconductor layer and the drain electrode so that the side surface of the first semiconductor layer and each electrode are not in contact with each other. With such a structure, a semiconductor device having less leakage current can be provided. Further, in a manufacturing method of the semiconductor device, only a step recessing the side surface of the first semiconductor layer by etching is added; that is, a semiconductor device can be easily manufactured without an increase in the number of masks.

Further, in a semiconductor device according to one embodiment of the present invention, a first semiconductor film to form the first semiconductor layer has higher carrier mobility than a second semiconductor film to form the second semiconductor layer in the above semiconductor device.

As the first semiconductor layer for forming a channel, a semiconductor film having higher carrier mobility than the second semiconductor layer is used, whereby a semiconductor device having high field effect mobility can be provided. Further, leakage current in an off state flows between the source and the drain through the second semiconductor layer formed of the film having relatively low carrier mobility; therefore, leakage current is suppressed.

Further, one embodiment of the present invention is an electronic appliance Including the above semiconductor device.

The semiconductor device in which leakage current is reduced as described above can be applied to a variety of electronic appliances such as a liquid crystal display device, an electronic book reader, or a portable terminal, whereby an electronic appliance with low power consumption can be realized.

Further, in a manufacturing method of a semiconductor device according to one embodiment of the present invention, a gate electrode layer is formed over an insulating surface; an insulating layer covering the gate electrode layer is formed; a first semiconductor film in contact with the insulating layer, a second semiconductor film, and a third semiconductor film having one conductivity type are stacked; a first semiconductor layer, a second semiconductor layer, and a third semiconductor layer are formed by forming a resist overlapping with the gate electrode layer over the third semiconductor film and then by etching the first semiconductor film, the second semiconductor film, and the third semiconductor film using the resist as a mask; the end portion of the first semiconductor layer is etched so that the end portion of the first semiconductor layer is positioned inside the second semiconductor layer; a conductive film which is in contact with the third semiconductor layer and is not in contact with the first semiconductor layer is formed; a first conductive layer and a second conductive layer are formed by selectively etching the conductive film so that the third semiconductor layer is exposed; and a first impurity semiconductor layer and a second impurity semiconductor layer are formed by etching a portion of the third semiconductor layer which does not overlap with the first conductive layer and the second conductive layer.

With such a manufacturing method, a semiconductor device in which leakage current is reduced can be manufactured without an increase in the number of masks.

According to the present invention, a semiconductor device in which leakage current is reduced can be provided. Further, a semiconductor device in which both of high field effect mobility and low leakage current are realized can be provided. Furthermore, an electronic appliance with low power consumption can be provided. In addition, a manufacturing method of a semiconductor device in which leakage current can be reduced without an increase in the number of masks can be provided.

BRIEF DESCRIPTION OF THE DRAWINGS

FIGS. 1A and 1B illustrate a semiconductor device according to one embodiment of the present invention.

DETAILED DESCRIPTION OF THE INVENTION

Figure 2A:
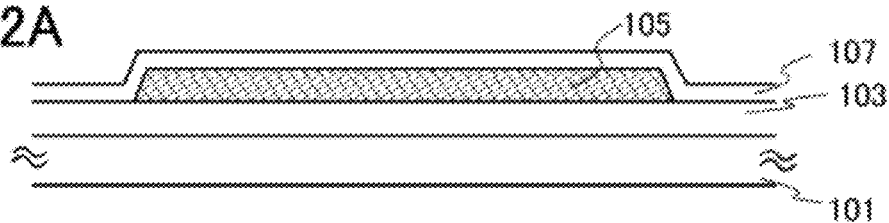
FIGS. 2A to 2E illustrate a manufacturing method of a semiconductor device according to one embodiment of the present invention.

Embodiments are described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description of the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

A transistor is one of a variety of semiconductor devices, and can amplify current or voltage and perform a switching operation for controlling conduction and non-conduction, for example. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Embodiment 1

In this embodiment, as an example of a semiconductor device of one embodiment of the present invention, a bottom-gate thin film transistor in which leakage current is reduced while high field effect mobility is realized will be described with reference to the drawings.

<Structural Example>

A structure of a transistor according to one embodiment of the present invention will be described with reference to FIGS. 1A and 1B. FIG. 1B is a schematic fop view of a transistor 100 and FIG. 1A is a schematic cross-sectional view along line A-A' in FIG. 1B.

The transistor 100 is provided over a base insulating layer 103 formed on a surface of a substrate 101. The transistor 100 includes a gate electrode layer 105 in contact with the base insulating layer 103, a gate insulating layer 107 covering the gate electrode layer 105, a first semiconductor layer 109 in contact with the gate insulating layer 107 and overlapping with the gate electrode layer 105, and a second semiconductor layer 111. Further, the transistor 100 includes impurity semiconductor layers 113a and 113b over the second semiconductor layer, a source electrode layer 115a in contact with the impurity semiconductor layer 113a, and a drain electrode layer 115b in contact with the impurity semiconductor layer 113b.

In addition, the transistor 100 includes a space 117a between the side surface of the first semiconductor layer 109 and the source electrode layer 115a and a space 117b between the side surface of the first semiconductor layer 109 and the drain electrode layer 115b, whereby the first semiconductor layer 109 is not in contact with any of the source electrode layer 115a and the drain electrode layer 115b.

For the first semiconductor layer 109, a semiconductor film having high carrier mobility can be used; a semiconductor film having at least higher carrier mobility than the semiconductor film for the second semiconductor layer 111, which is described later, is used. Here, as the semiconductor film having high carrier mobility, a microcrystalline semiconductor film of silicon, germanium, silicon germanium, of the like or a polycrystalline semiconductor film thereof can be used. Here, as the semiconductor film for the first semiconductor layer 109, a microcrystalline semiconductor film on which laser annealing or heat treatment for crystallization is not performed is preferably used because the manufacturing process can be simplified.

As the second semiconductor layer 111, a semiconductor film most part of which is amorphous and serves as a buffer layer can be used.

In such a manner, the transistor 100 can have high field effect mobility owing to the first semiconductor layer 109 formed of the semiconductor film having high carrier mobility. Further, since the side surface of the first semiconductor layer 109 is not in contact with any of the source electrode layer 115a and the drain electrode layer 115b, leakage current in an off state which flows between the source electrode layer 115a and the drain electrode layer 115b through the first semiconductor layer 109 is suppressed, so that the transistor 100 serves as a transistor in which the off-state leakage current is extremely low.

<Example of Manufacturing Method>

An example of a manufacturing process of the transistor 100 will be described below with reference to FIGS. 2A to 2E.

First, a base insulating layer 103 is formed over a substrate 101.

The substrate 101 is a substrate having an insulating surface; for example, a plastic substrate or the like can be used as long as it can withstand the processing temperature in this manufacturing process as well as a glass substrate, a quartz substrate, a ceramic substrate, or a semiconductor substrate.

As the base insulating layer 103, an insulating film having a function of suppressing diffusion of impurities from the substrate 101 can be used. For example, a single-layer structure or a stacked, structure including a silicon oxide film, a silicon nitride film, or a silicon oxide film containing nitrogen can be, used. Further, the above described films can be formed by a plasma CVD method or the like, for example. Note that the silicon oxide film containing nitrogen and the silicon nitride film each serve as a blocking layer that prevents diffusion of an impurity such as an alkali metal from a glass substrate.

In this embodiment, a glass substrate is used as the substrate 101 and a silicon oxynitride film is formed by a plasma CVD method as the base insulating layer 103.

Next, after a gate electrode layer 105 is formed, a gate insulating layer 107 covering the gate electrode layer 105 is formed.

The gate electrode layer 105 may be formed in such a manner that, for example, a conductive film (e.g., a metal film, a semiconductor film to which an impurity of one conductivity type is added, or a conductive metal oxide film) is formed by a sputtering method, an etching mask is formed over the conductive film, and etching is performed thereon. Alternatively, an ink-jet method or the like may be used. A conductive film to form the gate electrode layer 105 may have a single-layer structure or a stacked structure including a plurality of layers. For example, a three-layer structure in which an Al film is sandwiched between Ti films may be employed. After the gate electrode layer 105 is formed, the etching mask is removed.

As the gate insulating layer 107, for example, an insulating film (e.g., a silicon nitride film, a silicon nitride oxide; film, a silicon oxynitride film, or a silicon oxide film) may be formed by a plasma CVD method. Note that the gate insulating layer 107 may have a single-layer structure or a stacked structure including a plurality of layers. A two-layer structure in which a silicon oxynitride layer is stacked over a silicon nitride layer is employed here, for example.

Note that "silicon nitride oxide" contains more nitrogen than oxygen and it preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are; performed using Rutherford backscattering spectrometry (RBS) and hydrogen forward scattering (HFS).

Note that "silicon oxynitride" contains more oxygen than nitrogen and it preferably contains oxygen, nitrogen, silicon, and hydrogen at concentrations ranging from 5.0 at. % to 70 at. %, 0.5 at. % to 15 at. %, 25 at. % to 35 at. %, and 0.1 at. % to 10 at. %, respectively in the case where measurements are performed using RBS and HFS.

Note that percentages of nitrogen, oxygen, silicon, and hydrogen fall within the ranges given above, where the total number of atoms contained in the silicon oxynitride or the silicon nitride oxide is defined as 100 at. %.

FIG. 2A is a schematic cross-sectional view at that time.

Next, a first semiconductor film, a second semiconductor film, and an impurity semiconductor film are stacked over the gate insulating layer 107. Then, the stacked-layer film is etched using an etching mask, so that a first semiconductor layer 109, a second semiconductor layer 111, and an impurity semiconductor layer 113 are formed.

Here, it is preferable that plasma treatment using gas including oxide (e.g., $N_2O$) be performed after formation of the gate insulating layer 107 before formation of the first semiconductor film.

The first semiconductor film to form the first semiconductor layer 109 is a semiconductor film most part of which is crystalline. As the crystalline semiconductor, a microcrystalline semiconductor can be given, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably more than or equal to 20 nm and less than or equal to 50 nm have grown in a direction of the normal to the substrate surface. Note that the crystal grain size here means a maximum diameter of a crystal grain in a plane parallel to the substrate surface. Further, the crystal grain includes an amorphous semiconductor region and a crystallite which is a minute crystal that can be regarded as a single crystal. The crystal grain may include a twin crystal.

Microcrystalline silicon may be used as the microcrystalline semiconductor. Microcrystalline silicon, which is one of microcrystalline semiconductors, has a peak of Raman spectrum which is shifted to a lower wave number side than 520 $cm^{-1}$ that represents single crystal silicon. That is, the peak of the Raman spectrum of microcrystalline silicon is within the range of from 520 $cm^{-1}$ which represents single crystal silicon, to 480 $cm^{-1}$ which represents amorphous silicon. In addition, microcrystalline silicon contains hydrogen or halogen of at least 1 at. % or more in order to terminate a dangling bond. Moreover, microcrystalline silicon contains a rare gas element such as He, Ar, Kr, or Ne to further promote lattice distortion, so that stability is increased and a favorable microcrystalline semiconductor can be obtained.

Note that the concentration of oxygen and nitrogen contained in the crystalline semiconductor film (measured by secondary ion mass spectrometry) is reduced, preferably less than $1 \times 10^{18}$ $cm^{-3}$, and the crystallinity can be increased.

The second semiconductor layer 111 is formed of a semiconductor film most part of which is amorphous and serves as a buffer layer. The semiconductor film preferably includes an amorphous semiconductor and a minute semiconductor crystal grain, and has lower energy at the Urbach edge, which is measured by a constant photocurrent method (CPM) or photoluminescence spectrometry and a smaller quantity of absorption spectra of defects, as compared to a conventional amorphous semiconductor. That is, as compared to the conventional amorphous semiconductor film, such a semiconductor film is a well-ordered semiconductor film which has few defects and a steep tail slope of a level at a band edge (a mobility edge) in the valence band.

The second semiconductor layer 111 may contain halogen and/or nitrogen. When nitrogen is contained, nitrogen may be contained as an NH group or an $NH_2$ group.

Note that here, an interface region between the first semiconductor layer 109 and the second semiconductor layer 111 preferably has microcrystalline semiconductor regions and an amorphous semiconductor region filling the space between the microcrystalline semiconductor regions. Specifically, the interface region between the first semiconductor layer 109 and the second semiconductor layer 111 includes a microcrystalline semiconductor region which extends in a conical or pyramidal shape from the first semiconductor layer 109 and a layer containing an amorphous semiconductor which is similar to the second semiconductor layer 111.

A buffer layer is formed using the second semiconductor layer 111, whereby the off-state current of a transistor can be reduced. Further, since the interface region has the conical or pyramidal microcrystalline semiconductor, resistance in the vertical direction (the film thickness direction), that is, resistance between the second semiconductor layer 111 and a source region or a drain region formed of impurity semiconductor layers 113a and 113b, can be lowered. Thus, the on-state current of the transistor can be increased. That is to say, as compared to the case of using the conventional amorphous semiconductor, the off-state current can be sufficiently reduced and reduction in the on-state current can be suppressed; thus, switching characteristics of the transistor can be improved.

A large portion of the above microcrystalline semiconductor region preferably includes crystal grains having a conical or pyramidal shape whose top gets narrower from the first semiconductor layer 109 toward the second semiconductor layer 111. Alternatively, a large portion of the above microcrystalline semiconductor region may include crystal grains having a conical or pyramidal shape whose top gets wider from the first semiconductor layer 109 toward the second semiconductor layer 111.

When the microcrystalline semiconductor region includes crystal grains having a conical or pyramidal shape whose top gets narrower from the first semiconductor layer 109 toward the second semiconductor layer 111 in the above interface region, the proportion of the microcrystalline semiconductor region on the first semiconductor layer 109 side is higher than that on the second semiconductor layer 111 side. The microcrystalline semiconductor region grows from a surface of the first semiconductor layer 109 in the film thickness direction. When the flow rate of hydrogen with respect to a deposition gas (for example, silane) is low (that is, the dilution ratio is low) in a raw material gas, or when the concentration of a raw material gas containing nitrogen is high, the crystal growth is suppressed in the microcrystalline semiconductor region to provide crystal grains in a conical or pyramidal shape, with the result that the semiconductor formed by deposition is mostly an amorphous semiconductor.

Further, the interface region preferably includes nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of a crystal included in the microcrystalline semiconductor region or at the interface between the microcrystalline semiconductor region and the amorphous semiconductor region. Thus, when the interface region includes nitrogen, preferably an NH group or an $NH_2$ group at a concentration of $1 \times 10^{20}$ $cm^{-3}$ to $1 \times 16^{21}$ $cm^{-3}$, dangling bonds of silicon atoms can be easily cross-linked with nitrogen, preferably an NH group or an $NH_2$ group, so that carriers can; flow more easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, the defect density at the interface between the microcrystalline semiconductor region and the amorphous semiconductor region or the interface between crystal grains can be reduced, so that bonds which inhibit carrier transfer can be reduced.

Note that the boundary between the first semiconductor layer 109 and the second semiconductor layer 111 is not clear as described above; however, the boundary is linearly shown in the drawings in this specification and the like for clarity.

The impurity semiconductor film to form the impurity semiconductor layer 113 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Therefore, for example, silicon to which P is added is used here. Note that the impurity semiconductor layer 113 may be formed using ah amorphous semiconductor or a crystalline semiconductor such as a microcrystalline semiconductor.

When the impurity semiconductor layer 113 is formed using an amorphous semiconductor, the flow rate of a dilution gas is greater than or equal to that of a deposition gas and less than or equal to 10 times that of the deposition gas, preferably greater than or equal to that of the deposition gas and less than or equal to 5 times that of the deposition gas. On the other hand, when the impurity semiconductor layer 113 is formed using a crystalline semiconductor, the flow rate of the dilution gas is greater than or equal to 10 times that of a deposition gas and less than or equal to 2000 times that of the deposition gas, preferably greater than or equal to 50 times that of the deposition gas and less than or equal to 200 times that of the deposition gas.

Note that it is preferable that the process from and including the step of forming the gate insulating layer 107 to and including the step of forming the semiconductor film of the impurity semiconductor layer 113 be performed successively in the same chamber. Impurities can be prevented from being included in any interface between the gate insulating layer 107 and the semiconductor film of the impurity semiconductor layer 113.

Next, a resist 119 is formed over the impurity semiconductor film, and the impurity semiconductor film, the second semiconductor film, and the first semiconductor film are etched using the resist 119 as an etching mask, so that the stacked layer of the first semiconductor layer 109, the second semiconductor layer 111, and the impurity semiconductor layer 113 are formed in an island-shape.

Figure 2B:
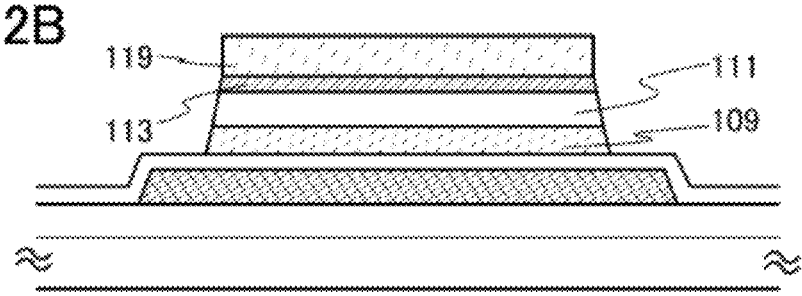

FIG. 2B illustrates a schematic cross-sectional view at this stage.

After that, the end portion of the first semiconductor layer 109 is etched so that the side surface is recessed.

An etching method in which an etching rate of an exposed portion (the second semiconductor layer 111, the impurity semiconductor layer 113, the gate insulating layer 107, or the like) other than the first semiconductor layer 109 having crystallinity is lower than that of the first semiconductor layer 109 having crystallinity can be applied for the etching. In particular, it is preferable that a condition that the etching selectivity of the first semiconductor layer 109 to the second semiconductor layer 111 can be sufficiently obtained be selected. For example, a wet etching using an aqueous solution containing, 2.38 wt % of tetramethylammonium hydroxide (TMAH) (manufactured by Tokyo Ohka Kogyo Co., Ltd., product name: NMD3, hereinafter referred to as NMD3) can be applied.

Figure 2C:
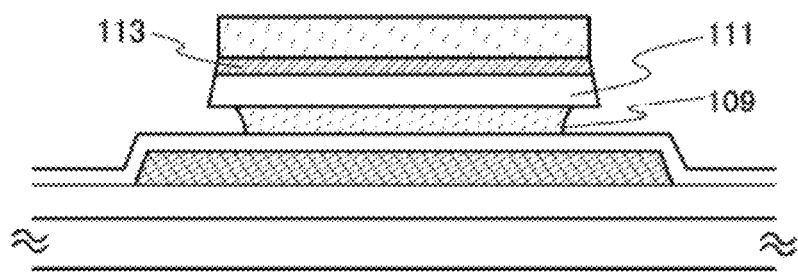

FIG. 2C illustrates a schematic cross-sectional view after the side surface of the first semiconductor layer 109 is recessed in such a manner.

Here, the side surface of the first semiconductor layer 109 is positioned at least inside the side surface of the second semiconductor layer 111. The side surface of the first semiconductor layer 109 is sufficiently recessed, whereby a space can be provided between a conductive film to be a source electrode and a drain electrode and the first semiconductor layer 109 so that the conductive film is not in contact with the first semiconductor layer 109.

Here, when the end portion of the first semiconductor layer 109 is etched, the end portion of the second semiconductor layer 111 may also be etched depending on the quality of the second semiconductor layer 111. Even in that case, the side surface of the first semiconductor layer 109 is positioned at least inside the side surface of the second semiconductor layer 111 according to one embodiment of the present invention.

Further, the end portion of the second semiconductor layer 111 may also be etched, and the side surface of the second semiconductor layer 111 is positioned inside the side surface of the impurity semiconductor layer 113, whereby the second semiconductor layer 111 and the conductive film to be a source electrode and a drain electrode are not in contact with each other. The structure in which the side surface of the second semiconductor layer 111 in addition to the side surface of the first semiconductor layer 109 is not in contact with any of the source electrode and the drain electrode enables leakage current of the transistor to be further reduced.

Figure 2D:
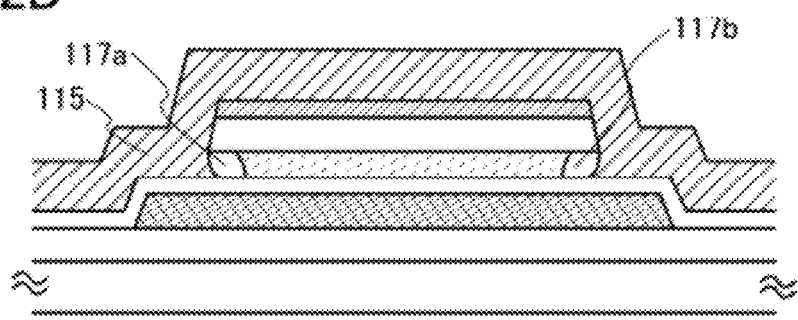

Next, after the resist 119 is removed, a conductive film 115 is formed (see FIG. 2D).

For the conductive film 115, a conductive film which is similar to the conductive film used for the gate electrode layer 105 as described above (e.g., a metal film, a semiconductor film to which an impurity of one conductivity type is added, or a conductive metal oxide film) can be used. Note that the conductive film 115 may have a single-layer structure or a stacked structure including a plurality of layers. A stacked structure of three layers in which an Al film is interposed between Ti films is employed here, for example.

The conductive film 115 is formed so that the first semiconductor layer 109 is not in contact with the conductive film 115. The conductive film 115 is formed in this manner; thus, spaces 117a and 117b are formed between the side surface of the first semiconductor layer 109 and the conductive film 115.

Next, the conductive film 115 is etched using an etching mask, and a source electrode layer 115a and a drain electrode layer 115b, are formed so that a space overlapping with the gate electrode layer 105 is provided. Then, the etching mask is removed.

Next, the impurity semiconductor layer 113 is etched using the source electrode layer 115a and the drain electrode layer 115b as an etching mask. Here, the etching is preferably performed with the use of a mixed gas of a Br-based gas, an F-based gas, and an oxygen gas. With the use of the mixed gas of a Br-based gas, a F-based gas, and an oxygen gas, the etching rate of the crystalline semiconductor film can be made small and the etching rate of the amorphous semiconductor film can be made large. That is, when the first semiconductor layer 109 is formed of a crystalline semiconductor film and the second semiconductor layer 111 is formed of an amorphous semiconductor film, the etching selectivity of the first semiconductor layer 109 to the second semiconductor layer 111 can be sufficiently obtained.

An HBr gas can be given as an example of the Br-based gas, and an $SF_6$ gas, a $CF_4$ gas or an $NF_3$ gas can be given as an example of the F-based gas. Note that the etching using the mixed gas is preferably performed with the use of an etching mask. Then, the impurity semiconductor layer 113 is preferably exposed to $H_2O$ plasma. Alternatively, plasma generated by a mixed gas of hydrogen and oxygen may be used instead of $H_2O$ plasma.

Figure 2E:
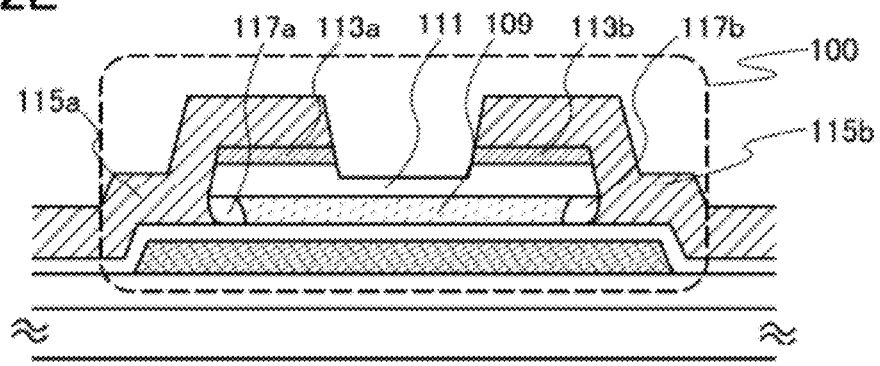

Through the above etching process, the impurity semiconductor layer 113a in contact with the source electrode layer 115a and the impurity semiconductor layer 113b in contact with the drain electrode layer 115b are formed (see FIG. 2E). Here, as illustrated in FIG. 2E, a portion of the second semiconductor layer 111 which does not overlap with any of die source electrode layer 115a and the drain electrode layer 115b may be reduced in thickness by the etching.

Through the above process, the transistor 100 can be manufactured without an increase in the number of photolithography steps, that is, the number of masks. In the transistor 166 formed through such a process, high field effect mobility can be realized by the first semiconductor layer 109 having high carrier mobility. Further, since the spaces 117a and 117b are provided so that the side surface of the first semiconductor layer 109 is hot in contact with any of the source electrode layer 115a and the drain electrode layer 115b, a transistor in which leakage current that flows in an off state is suppressed can be obtained.

Note that in the transistor 100, by increasing the thickness of the first semiconductor layer 109, the on-state current can be increased. Even in that case, the side surface of the first semiconductor layer 109 is not in contact with any of the source electrode layer 115a and the drain electrode layer 115b, so that an increase in off-state current accompanied by an increase in the thickness of the first semiconductor layer 109 can be suppressed.

Note that this embodiment can be combined with any of the other embodiments and examples in this specification as appropriate.

Embodiment 2

In this embodiment, an example of a structure and a manufacturing method of a transistor having a structure different from that of the transistor described in Embodiment 1 as an example will be described. In this embodiment, in particular, a transistor in which leakage current is suppressed while high on-state current is realized will be described.

<Structural Example>

Figure 3:
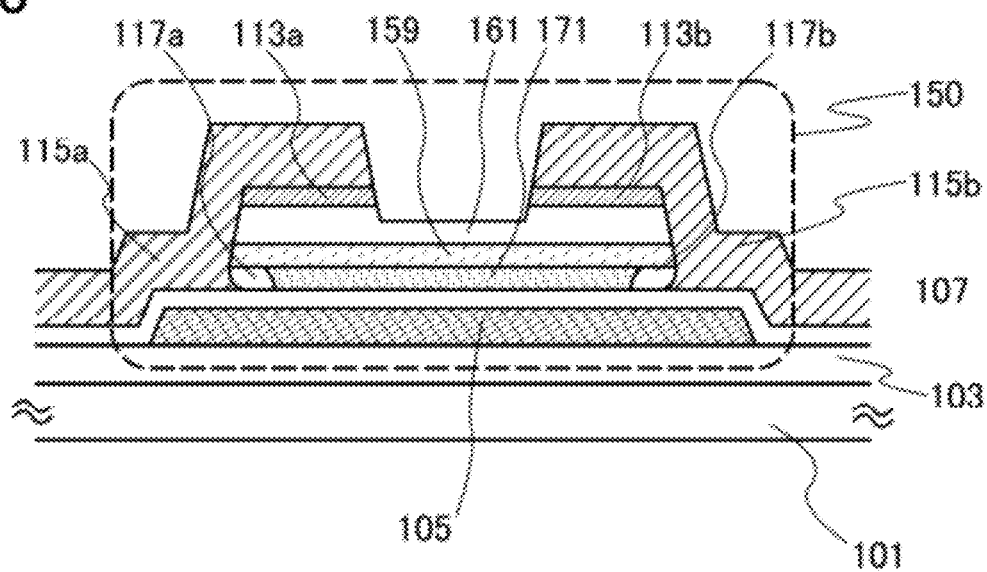
FIG. 3 illustrates a semiconductor device according to one embodiment of the present invention.

FIG. 3 illustrates a schematic cross-sectional view of a transistor 150 described in this embodiment as an example.

The transistor 150 has a structure which is similar to that of the transistor 100 described in Embodiment 1 as an example except for the stacked structure of the semiconductor layer.

The transistor 150 includes semiconductor layers in which a first semiconductor layer 171, a second semiconductor layer 159, and a third semiconductor layer 161 are stacked. Further, the transistor 150 includes spaces 117a and 117b so that the side surface of the first semiconductor layer 171 is not in contact with any of a source electrode layer 115a and a drain electrode layer 115b.

The second semiconductor layer 159 is formed using a material similar to that of the first semiconductor layer 109 described in Embodiment 1 as an example. Further, the third semiconductor layer 161 is formed using a material similar to that of the second semiconductor layer 111 described in Embodiment 1 as an example. Therefore, the semiconductor film to form the second semiconductor layer has higher carrier mobility than the semiconductor film to form the third semiconductor layer.

The first semiconductor layer 171 is formed of a semiconductor film which has higher carrier mobility than the semiconductor film to form the second semiconductor layer. For example, as a semiconductor film having higher carrier mobility than a microcrystalline silicon film, a microcrystalline semiconductor film or a polycrystalline semiconductor film using germanium, germanium to which silicon is added, or a compound semiconductor such as a Group II-VI semiconductor or a Group III-V semiconductor can be given.

In this embodiment, as a film to form the first semiconductor layer 171, a film to form the second semiconductor layer 159, and a film to form the third semiconductor layer 161, a microcrystalline germanium film, a microcrystalline silicon film, and an amorphous silicon film are used, respectively.

As the first semiconductor layer 171 which is the closest to a gate electrode layer 105 in the three semiconductor layers of the transistor 150, a semiconductor film having extremely high carrier mobility such as a microcrystalline germanium film is used, whereby high on-state current can be realized.

Further, the transistor 150 includes the spaces 117a and 117b so that the First semiconductor-layer 171 is not in contact with any of the source electrode layer 115a and the drain electrode layer 115b, whereby off-state leakage current can be reduced even when a semiconductor film having high carrier mobility such as a microcrystalline germanium film is used.

When the transistor 150 is sufficiently on, current flows in the first semiconductor layer 171 in the lateral direction (the direction perpendicular to the thickness direction). Further, current flows in the second semiconductor layer 159 in the lateral direction, and current flows in both end portions of the second semiconductor layer 159 in the vertical direction (the thickness direction). Furthermore, in the third semiconductor layer 161, current flows mainly in both end portions thereof in the vertical direction. Here, as a semiconductor film to form the second semiconductor layer 159 and a semiconductor film to form the third semiconductor layer 161, a microcrystalline semiconductor film and an amorphous semiconductor film which are described in Embodiment 1 are used, respectively, whereby the resistance in the vertical direction (the thickness direction) can be reduced, so that reduction in the on-state current of the transistor 150 can be suppressed.

On the other hand, when the transistor 150 is off, almost no current flows in the first semiconductor layer 171 having high carrier mobility, because the first semiconductor layer 171 is not in contact with arty of the source electrode layer 115a and the drain electrode layer 115b. Leakage current flows from the source to the drain mainly through the second semiconductor layer 159 and the third semiconductor layer 161 which have lower carrier mobility than the first semiconductor layer 171; therefore, the off-state current of the transistor 150 can be sufficiently reduced.

That is, the structure in which the first semiconductor layer 171 formed of a semiconductor film having extremely high carrier mobility, the second semiconductor layer 159, and the third semiconductor layer 161 are stacked, and further the side surface of the first semiconductor layer 171 is not in contact with any of the source electrode layer 115a and the drain electrode layer 115b is employed, whereby both of low off-state current and high on-state current can be realized.

Here, the structure in which the side surface of the second semiconductor layer 159 is also not in contact with any of the source electrode layer 115a and the drain electrode layer 115b may be employed. With such a structure, the off-state current can be further reduced.

Further, in particular, when the difference between the band gap of the semiconductor to form the first semiconductor layer 171 for forming a channel and the band gap of the semiconductor to form the third semiconductor layer which is a buffer layer is large, a semiconductor having a band cap which reduces this difference is used for the second semiconductor layer 159, whereby the offset of the band gap can be reduced and reduction in the on-state current can be suppressed.

For example, as a semiconductor film to form the first semiconductor layer 171, a semiconductor film to form the second semiconductor layer 159, and a semiconductor film to form the third semiconductor layer 161, a film containing germanium as its main component, a microcrystalline silicon film, and an amorphous silicon film are used, respectively. The band gap of microcrystalline germanium is approximately 0.7 eV and the band gap of amorphous silicon is approximately 1.4 eV to 1.8 eV; that is, the difference is large. However, microcrystalline silicon having a band gap of approximately 1.1 eV to 1.5 eV is provided between these films, whereby the offset of the band gap between the first semiconductor layer 171 and the third semiconductor layer 161 is reduced and reduction in the current which flows between the first semiconductor layer 171 and the third semiconductor layer 161 through the second semiconductor layer 159 can be suppressed.

Further, it is preferable that a region where both silicon and germanium exist, for example, be provided at a boundary between the first semiconductor layer 171 and the second semiconductor layer 159 because the offset of the band gap at the boundary is reduced.

<Example of Manufacturing Process>

An example of a manufacturing process of the transistor 150 will be described below with reference to FIGS. 4A to 4D. Note that the description that overlaps with the description of the portions described in Embodiment 1 is omitted or is simply given.

First, as in Embodiment 1, a base insulating layer 103, a gate electrode layer 105, and a gate insulating layer 107 are formed over a substrate 101.

Next, a first semiconductor film, a second semiconductor film, a third semiconductor film, and an impurity semiconductor film are stacked. Then, the stacked-layer film is etched using an etching mask, so that a first semiconductor layer 171, a second semiconductor layer 159, a third semiconductor layer 161, and an impurity semiconductor layer 113 are formed.

As a semiconductor film to form the first semiconductor layer 171, the semiconductor film described in the above structural example can be used, and the semiconductor film to form the first semiconductor layer 171 can be formed by a deposition method such as a plasma CVD method. In this embodiment, a microcrystalline germanium film is formed by a plasma CVD method.

The second semiconductor film to form the second semiconductor layer 159, the third semiconductor film to form the third semiconductor layer 161, and the impurity semiconductor film can be formed using the materials and the methods which are similar to those of the first semiconductor film, the second semiconductor film, and the impurity semiconductor film which are described in Embodiment 1 as an example, respectively. In this embodiment, a microcrystalline silicon film, an amorphous silicon film, and an amorphous silicon film to which P is added are used as the second semiconductor film, the third semiconductor film, and the impurity semiconductor film, respectively.

Figure 4A:
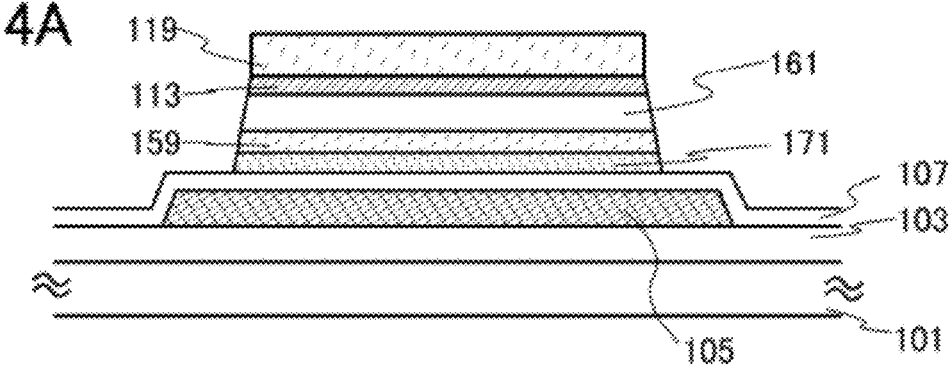
FIGS. 4A to 4D illustrate a manufacturing method of a semiconductor device according to one embodiment of the present invention.

After that, a resist 119 is formed over the impurity semiconductor film, and the impurity semiconductor film, the third semiconductor film, the second semiconductor film, and the first semiconductor film are etched using the resist 119 as an etching mask, so that the stacked layer of the first semiconductor layer 171, the second semiconductor layer 159, the third semiconductor layer 161, and the impurity semiconductor layer 113 are formed in an island-shape. FIG. 4A illustrates a schematic cross-sectional view at this stage.

Next, the end portion of the first semiconductor layer 171 is etched so that the side surface is recessed.

An etching method in which an etching rate of an exposed portion of each layer other than the first semiconductor layer 171 is lower than that of the first semiconductor layer 171 can be applied for the etching.

Note that etching of the end portion of the first semiconductor layer 171 may be performed at the same time as the step of forming the stacked layer of the semiconductor layers having an island-shape described above. In this embodiment, the stacked layer having an island-shape of the first semiconductor layer 171, the second semiconductor layer 159, the third semiconductor layer 161, and the impurity semiconductor layer 113 is formed by a dry etching method using $Cl_2$ gas, and the end portion of the first semiconductor layer 171 is successively etched so that the side surface is recessed.

Figure 4B:
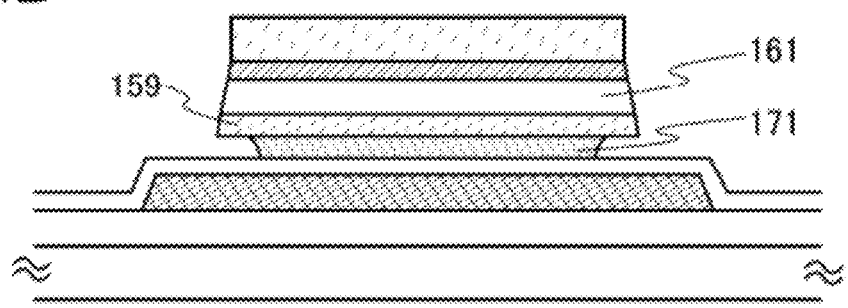

FIG. 4B illustrates a schematic cross-sectional view at this stage.

Here, the side surface of the first semiconductor layer 171 is positioned at least inside the side surface of the second semiconductor layer 159. The side surface of the first semiconductor layer 171 is sufficiently recessed, whereby a space can be provided between a conductive film to be a source electrode and a drain electrode and the first semiconductor layer 171 so that the conductive film is not in contact with the first semiconductor layer 171.

Further, the end portion of the second semiconductor layer 159 may also be etched, and the side surface of the second semiconductor layer 159 is positioned inside the side surface of third semiconductor layer 161, whereby the second semiconductor layer 159 and the conductive film to be a source electrode and a drain electrode are not in contact with each other. The structure in which the side surface of the second semiconductor layer 159 in addition to the side surface of the first semiconductor layer 171 is not in contact with any of the source electrode and the drain electrode enables leakage current of the transistor to be further reduced.

Figure 4C:
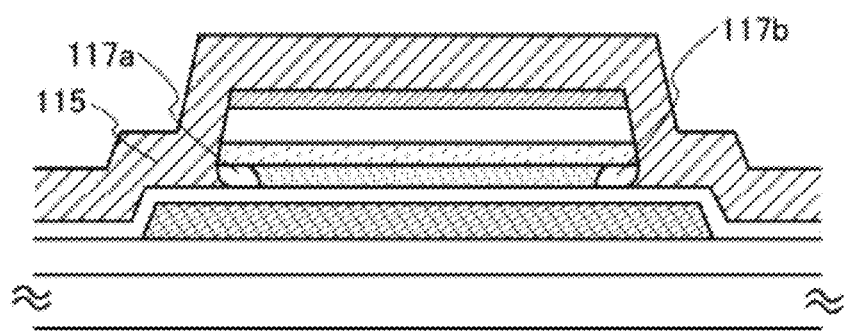
Figure 4D:
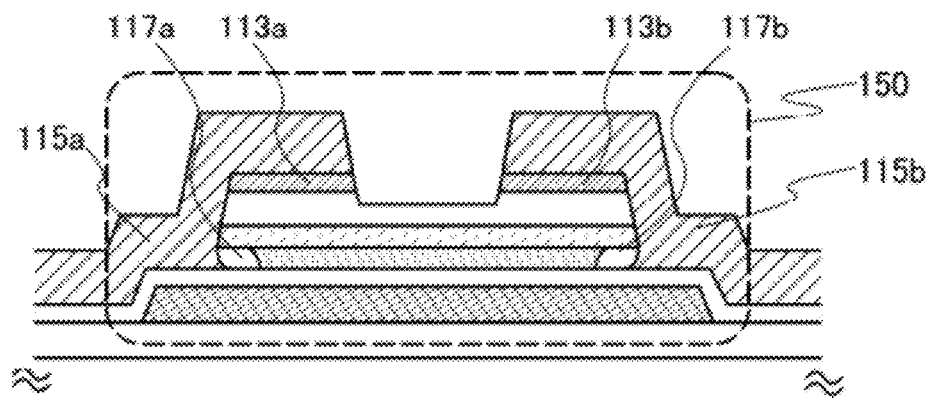

Next, the resist 119 is removed, and then a conductive film 115 is formed so that the conductive film 115 and the side surface of the first semiconductor layer 171 are not in contact with each other (see FIG. 4C). The conductive film 115 can be formed using the material and the method which are similar to those described in Embodiment 1 as an example.

The conductive film 115 is formed so that the first semiconductor layer 171 is not in contact with the conductive film 115, whereby spaces 117a and 117b are formed between the side surface of the first semiconductor layer 171 and the conductive film 115.

Next, the conductive film 115 is etched using an etching mask, and a source electrode layer 115a and a drain electrode layer 115b are formed. Then, after the etching mask is removed, the impurity semiconductor layer 113 is etched, so that the impurity semiconductor layers 113a and 113b are formed (see FIG. 4D). The conductive film 115 and the impurity semiconductor layer 113 can be etched by the method described in Embodiment 1 as an example as appropriate.

Through the above process, the transistor 150 can be manufactured without an increase in the number of photolithography steps, that is, the number of masks. In the transistor 150 manufactured through such a process, extremely high field effect mobility can be realized by the stacked layer of the first semiconductor layer 171 having extremely high carrier mobility and the second semiconductor layer 159 having high carrier mobility. Further, since the spaces 117a and 117b are provided so that the side surface of the first semiconductor layer 171 is not in contact with any of the source electrode layer 115a and the drain electrode layer 115b, a transistor in which leakage current that flows in an off state is suppressed can be obtained.

Note that this embodiment can be combined with any of the other embodiments and examples in this specification as appropriate.

Embodiment 3

In this embodiment, a semiconductor device to which a transistor manufactured according to any of the above embodiments is applied will be described with reference to FIG. 5 and FIGS. 6A to 6C.

As a semiconductor device to which a thin film transistor manufactured according to any of the above embodiments is applied, electronic paper can be given. Electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like.

Further, as a semiconductor device to which a thin film transistor manufactured according to any of the above embodiments is applied, a variety of electronic appliances (including an amusement machine) can be given in addition to electronic paper. Examples of electronic appliances are a television set (also referred to as a television or a television receiver), a monitor of a computer or the like (a liquid crystal display device, an organic EL device, or the like), a digital camera, a digital video camera, a digital photo frame, a mobile phone (also referred to as a cellular phone or a cellular phone device), a portable game machine, a portable information terminal, an audio reproducing device, and a large-sized game machine such as a pachinko machine.

Figure 5:
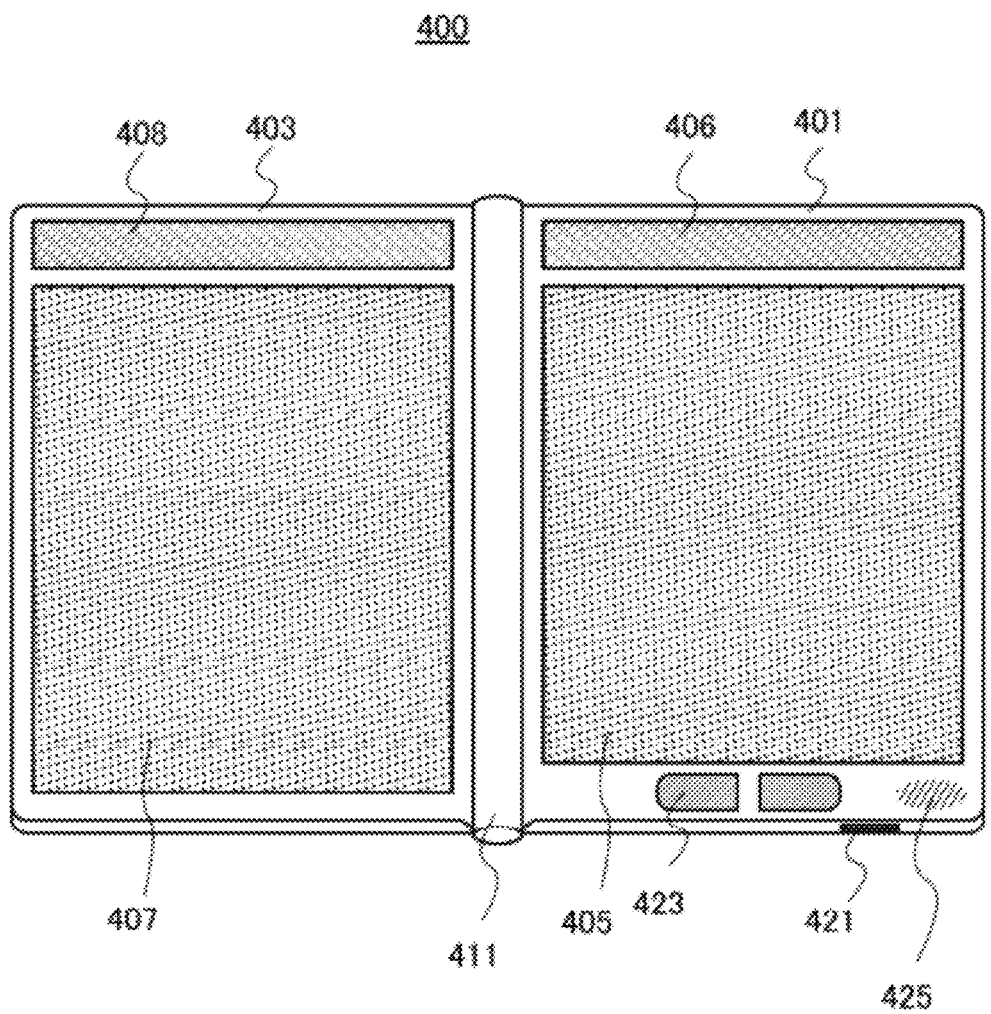
FIG. 5 illustrates an electronic appliance according to one embodiment of the present invention.

FIG. 5 illustrates an example of an electronic book reader. For example, an electronic book reader 400 includes two housings 401 and 403. The housings 401 and 403 are combined with each other with a hinge 411 so that the electronic book reader 400 can be opened and closed with the hinge 411 as an axis. With such a structure, the electronic book reader 400 can be handled like a paper book.

A display portion 405 and a photoelectric conversion element 406 are incorporated in the housing 401. A display portion 407 and a photoelectric conversion element 408 are incorporated in the housing 403. The display portions 405 and 407 may display one image or different images. In the case where the display portions 405 and 407 display different images, for example, a display portion on the right side (the display portion 405 in FIG. 5) can display text and a display portion on the left side (the display portion 407 in FIG. 5) can display images.

FIG. 5 illustrates an example in which the housing 401 includes an operation portion and the like. For example, the housing 401 includes a power source 421, operation keys 423, a speaker 425, and the like. Pages can be turned by the operation keys 423. Note that a keyboard, a pointing device, or the like may also be provided on the surface of the housing, on which the display portion is provided. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. Furthermore, the electronic book reader 400 may function as an electronic dictionary.

Further, the electronic book reader 400 may transmit and receive data wirelessly. Through wireless communication, desired book data or the like can be purchased and downloaded from an electronic book server.

Figure 6A:
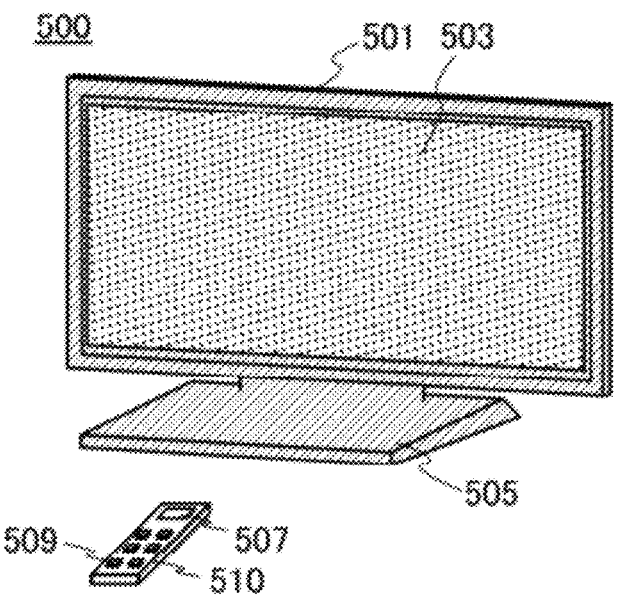
FIGS. 6A to 6C each illustrate an electronic appliance according to one embodiment of the present invention.

FIG. 6A illustrates an example of a television set. In a television set 500, a display portion 503 is incorporated in a housing 501. Images can be displayed on the display portion 503. Here, the housing 501 is supported by a stand 505.

The television set 500 can be operated by an operation switch of the housing 501 or a separate remote controller 510. Channels can be switched and volume can be controlled with operation keys 509 of the remote controller 510, whereby an image displayed on the display portion 503 can be controlled. The remote controller 510 may be provided with a display portion 507 for displaying data output from the remote controller 510.

Note that the television set 500 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 6B:
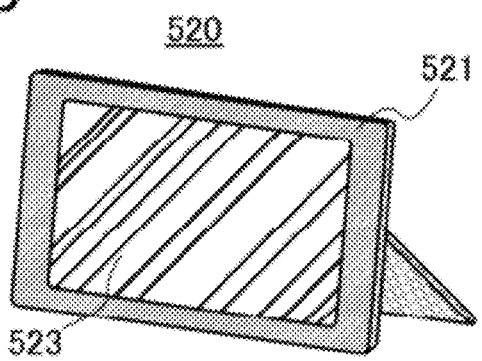

FIG. 6B illustrates an example of a digital photo frame. For example, a display portion 523 is incorporated in a housing 521 of a digital photo frame 520. The display portion 523 can display a variety of images. For example, the display portion 523 can display data of an image taken with a digital camera or the like and function as a normal photo frame.

Note that the digital photo frame 520 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 520. For example, a memory storing data of an image taken with a digital camera is inserted into the storage medium inserting portion of the digital photo frame and the image data is imported, whereby the imported image data can be displayed on the display portion 523.

The digital photo frame 520 may have a structure capable of wirelessly transmitting and receiving data. The structure may be employed in which desired image data is transferred wirelessly to be displayed.

Figure 6C:
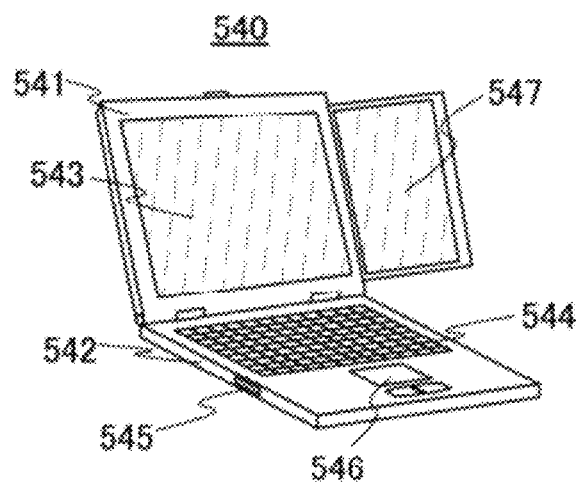

FIG. 6C is a perspective view illustrating an example of a portable computer.

In the portable computer of FIG. 6C, a top housing 541 having a display portion 543 and a bottom housing 542 having a keyboard 544 can overlap with each other by closing a hinge unit which connects the top housing 541 and the bottom housing 542. The portable computer of FIG. 6C can be convenient for carrying, and in the case of using the keyboard for input, the hinge unit is opened and the user can input looking at the display portion 543.

The bottom housing 542 has a pointing device 546 with which input can be performed, in addition to the keyboard 544. When the display portion 543 is a touch screen, input can be performed by touching part of the display portion 543. The bottom housing 542 includes an arithmetic function portion such as a CPU or hard disk. In addition, the bottom housing 542 has an external connection port 545 into which another device, for example, a communication cable compliant with communication standards of a USB is inserted.

The top housing 541 further includes a display portion 547 which can be kept in the top housing 541 by being slid therein. Thus, a large display screen can be realized. In addition, the user can adjust the orientation of a screen of the display portion 547 which can be kept in the top housing 541. When the display portion 547 which can be kept in the top housing 541 is a touch screen, input can be performed by touching part of the display portion 547 which can be kept in the top housing 541.

The display portion 543 or the display portion 547 which can be kept in the top housing 541 is formed with an image display device of a liquid crystal display panel, a light-emitting display panel such as ah organic light-emitting element or an inorganic light-emitting element, or the like.

In addition, the portable computer 540 illustrated in FIG. 6C can include a receiver and the like and can receive a television broadcast to display images on the display portion. The user can watch a television broadcast when the whole screen of the display portion 547 is exposed by sliding the display portion 547 and the angle of the screen is adjusted while the hinge unit which connects the top housing 541 and the bottom housing 542 is kept closed. In this case, the hinge, unit is not opened and display is, not performed on the display portion 543. In addition, start up of only a circuit for displaying a television broadcast is performed. Therefore, power consumption can be the minimum, which is useful for the portable computer whose battery capacity is limited.

The transistor described in any of the above embodiments as an example, in which high field effect mobility and extremely low leakage current are realized, is applied to a semiconductor device such as an electronic appliance, whereby a semiconductor device which operates at high speed and consumes less power can be achieved.

Note that this embodiment can be combined with any of the other embodiments and examples in this specification as appropriate.

Example 1

In this example, transistors were fabricated by the manufacturing methods described in Embodiment 1 and Embodiment 2 and the cross sections of the transistors were observed. The observation results will be described with reference to FIGS. 7A and 7B.

Note that a sample fabricated by the manufacturing method described in Embodiment 1 is Sample 1 and a sample fabricated by the manufacturing method described in Embodiment 2 is Sample 2. Here, in order to avoid repeated description, the same steps in the manufacturing processes of Sample 1 and Sample 2 will be described without distinction.

First, a 200-nm-thick silicon oxynitride film was formed as a base insulating layer over a glass substrate by a plasma CVD method.

Next, a stacked-layer film of a 50-nm-thick titanium film, a 100-nm-thick aluminum film, and a 50-nm-thick titanium film was formed by a sputtering method, and then an unnecessary portion thereof was etched by a photolithography method, so that a gate electrode layer was obtained.

After that, a gate insulating film covering the gate electrode layer and the base insulating layer and a stacked-layer film of semiconductor layers were formed by a plasma CVD method.

In Sample 1, as the gate insulating film, a first semiconductor film, a second semiconductor film, and an impurity semiconductor film, a 300-nm-thick silicon nitride film, a 30-nm-thick microcrystalline germanium film, a 175-nm-thick amorphous silicon film, and a 50-nm-thick amorphous silicon film to which P was added were successively formed, respectively.

On the other hand, in Sample 2, as the gate insulating film, a first semiconductor film, a second semiconductor film, a third semiconductor film, and an impurity semiconductor film, a 300-nm-thick silicon nitride film, a 10-nm-thick microcrystalline germanium film, a 20-nm-thick microcrystalline silicon film, a 175-nm-thick amorphous silicon film, and a 50-nm-thick amorphous silicon film to which P was added were successively formed, respectively.

Here, the silicon nitride film was formed under the following condition: a mixed gas of $SiH_4$, $NH_3$, $N_2$, and $H_2$ was used; the RF power source frequency was 13.56 MHz; the RF power source was 200 W; the pressure was 200 Pa; the temperature of an upper electrode was 200° C.; and the temperature of a lower electrode was 300° C. The microcrystalline germanium film was formed under the following condition: a mixed gas of $GeH_4$ and $H_2$ was used; the RF power source frequency was 13.56 MHz; the RF power source was 120 W; the pressure was 1237 Pa; and the substrate temperature was 200° C. The microcrystalline silicon film was formed under the following condition: a mixed gas of $SiH_4$, $H_2$, and Ar was used; the RF power source frequency was 13.56 MHz; the RF power source was 120 W; the pressure was 1.237 Pa; the temperature of the upper electrode was 200° C.; and the temperature of the lower electrode was 300° C. The amorphous silicon film was formed under the following condition: a mixed gas of $SiH_4$, $NH_3$, $H_2$, and Ar was used; the RF power source frequency was 13.56 MHz; the RF power source was 60 W; the pressure was 350 Pa; the temperature of the upper electrode was 200° C.; and the temperature of the lower electrode was 300° C. Further, the amorphous silicon film to which P was added was formed under the following condition: a mixed gas of $SiH_4$, $PH_3$, and $H_2$ was used; the RF power source frequency was 13.56 MHz; the RF power source was 30 W; the pressure was 60 Pa; the temperature of the upper electrode was 200° C.; and the temperature of the lower electrode was 300° C.

Next, over each of Sample 1 and Sample 2, a resist was formed and the stacked-layer film of the semiconductor layers was etched using the resist as an etching mask to be processed into an island-shape. In succession to this, the end portion of the layer formed of a microcrystalline germanium film (the first semiconductor layer in Sample 1 and the first semiconductor layer in Sample 2) was etched so that the side surface was recessed.

The etching was performed by an inductively coupled plasma (ICP) etching method which was one of dry etching methods under the following condition: $Cl_2$ gas was used as an etching gas; the RF power source frequency was 13.56 MHz; the RF power source was 1000 W; the substrate bias power was 80 W; the pressure was 1.51 Pa; and the temperature of an electrode was 40° C.

Next, after the resist was removed, as a conductive layer, a stacked-layer film of a 50-nm-thick titanium film, a 200-nm-thick aluminum film, and a 50-nm-thick titanium film was formed by a sputtering method.

After that, a resist was formed and the conductive layer and the impurity semiconductor layer were etched using the resist as a resist mask, so that a source electrode layer, a drain electrode layer, and an impurity semiconductor layer were formed, then, the resist was removed.

The etching was performed by an ICP etching method under the following condition: a mixed gas of $BCl_3$ and $Cl_2$ gas was used as an etching gas; the RF power source frequency was 13.56 MHz; the RF power source was 450 W; the substrate bias power was 100 W; and the pressure was 1.9 Pa.

Lastly as a protective film, a 300-nm-thick silicon nitride film was formed by a plasma CVD method.

A cross section of each of Sample 1 and Sample 2 obtained in this manner was observed by scanning transmission electron microscopy (STEM).

Figure 7A:
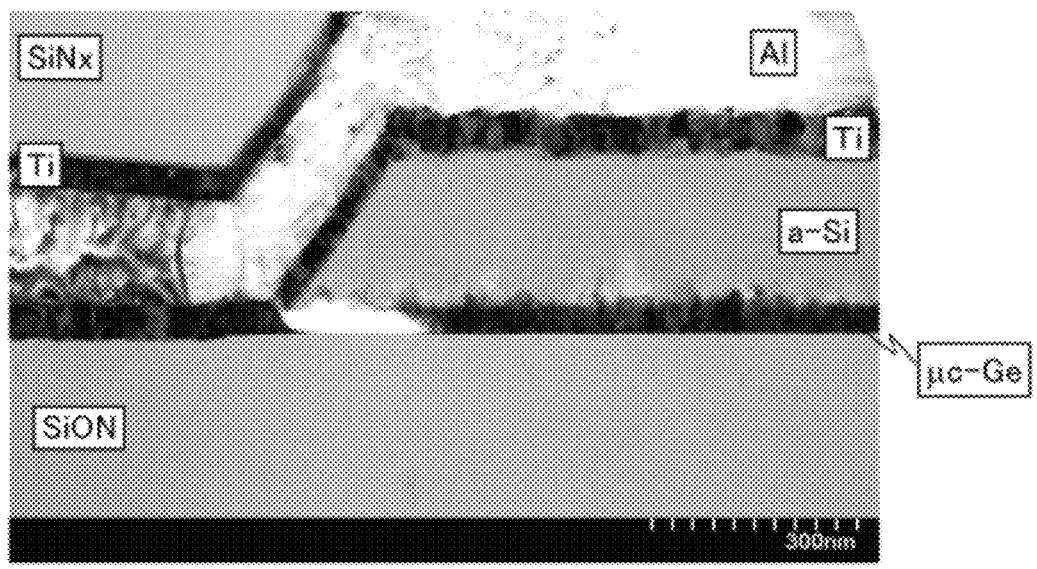
FIGS. 7A and 7B are STEM images according to an example.

FIG. 7A is a STEM image showing a vicinity of the end portion of the first semiconductor layer in Sample 1. It was confirmed that the side surface of the first semiconductor layer formed of a microcrystalline germanium film was recessed by etching and was positioned inside the side surface of the second semiconductor layer formed of an amorphous silicon film. Further, it was confirmed that the conductive layer using Ti was in contact with the side surface of the second semiconductor layer and was not in contact with the first semiconductor layer. In addition, a cross section in which a space whose length was about 200 nm in the direction parallel to the substrate was provided between the conductive layer and the first semiconductor layer was confirmed.

Figure 7B:
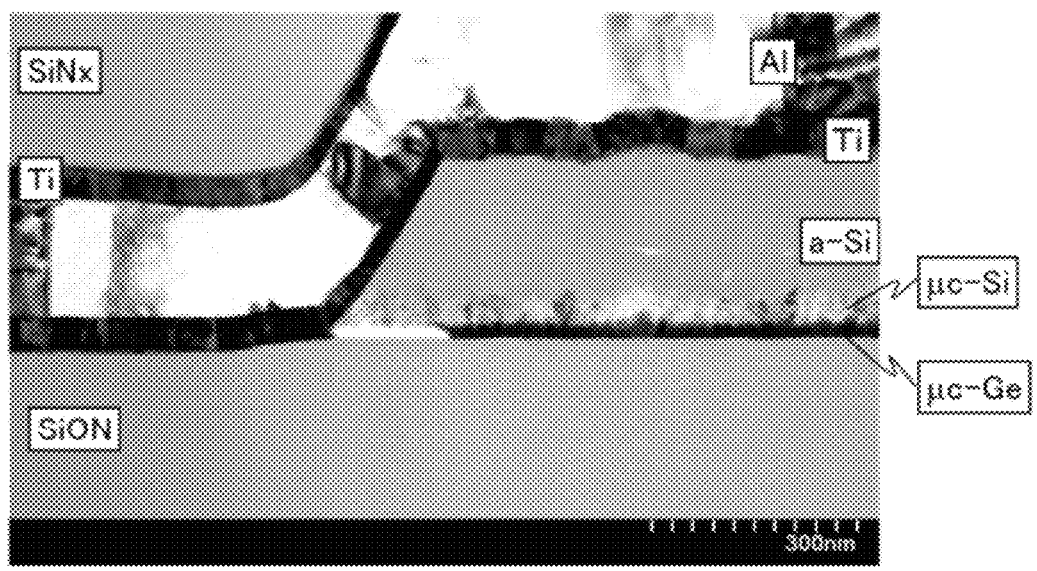
Figure 8:
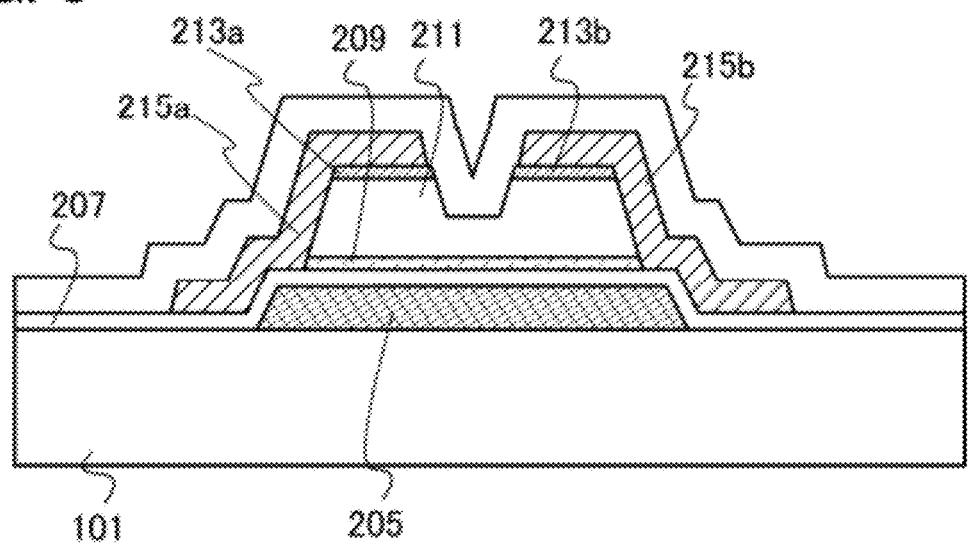
FIG. 8 illustrates a conventional semiconductor device.

FIG. 7B is a STEM image showing a vicinity of the end portion of the first semiconductor layer in Sample 2. As in Sample 1, it was confirmed that the side surface of the first semiconductor layer formed of a microcrystalline germanium film was recessed by etching and was positioned inside the side surface of the second semiconductor layer formed of a microcrystalline silicon film. Further, it was confirmed that the conductive layer using Ti was in contact with the side surface of the second semiconductor layer and the side surface of the third semiconductor layer and was not in contact with the first semiconductor layer. In addition, a cross section in which a space whose length is about 180 nm in the direction parallel to the substrate was provided between the conductive layer and the first semiconductor layer was confirmed.

This application is based on Japanese Patent Application serial no. 2011-034295 filed with Japan Patent Office on Feb. 21, 2011, the entire contents of which are hereby incorporated by reference.

What is claimed is:

1. A semiconductor device comprising:
    a gate electrode layer and a first semiconductor layer over an insulating surface;
    a second semiconductor layer provided on and in contact with the first semiconductor layer;
    a gate insulating layer provided between the gate electrode layer and the first semiconductor layer;
    a first impurity semiconductor layer and a second impurity semiconductor layer, the first impurity semiconductor layer and the second impurity semiconductor layer being provided in contact with the second semiconductor layer and separated from each other;
    a first conductive layer electrically connected to the first impurity semiconductor layer; and
    a second conductive layer electrically connected to the second impurity semiconductor layer,
    wherein an end portion of the first semiconductor layer is positioned inside the second semiconductor layer so that the first semiconductor layer is not in contact with any of the first conductive layer and the second conductive layer,
    wherein a space section is defined by an opening formed by the end portion of the first semiconductor layer, the second semiconductor layer, the first conductive layer, and the gate insulating layer.

2. The semiconductor device according to claim 1, wherein the first semiconductor layer has a higher carrier mobility than the second semiconductor layer.

3. An electronic appliance comprising the semiconductor device according to claim 1.

4. A manufacturing method of a semiconductor device, comprising:
    forming a gate electrode layer over an insulating surface;
    forming an insulating layer covering the gate electrode layer;
    stacking a first semiconductor film in contact with the insulating layer, a second semiconductor film, and a third semiconductor film having one conductivity type;
    forming a resist overlapping with the gate electrode layer over the third semiconductor film and etching the first semiconductor film, the second semiconductor film, and the third semiconductor film using the resist as a mask to form a first semiconductor layer, a second semiconductor layer, and a third semiconductor layer;
    etching an end portion of the first semiconductor layer so that the end portion of the first semiconductor layer is positioned inside the second semiconductor layer;
    forming a conductive film which is in contact with the third semiconductor layer and is not in contact with the first semiconductor layer;
    selectively etching the conductive film so that the third semiconductor layer is exposed to form a first conductive layer and a second conductive layer; and
    etching a portion of the third semiconductor layer which does not overlap with the first conductive layer and the second conductive layer to form a first impurity semiconductor layer and a second impurity semiconductor layer.

5. The manufacturing method of the semiconductor device according to claim 4,
    wherein the end portion of the first semiconductor layer is etched with a wet etching.

6. The manufacturing method of the semiconductor device according to claim 4,
    wherein the end portion of the first semiconductor layer is etched with a dry etching.

7. The manufacturing method of the semiconductor device according to claim 4, further comprising:
    removing the resist after etching the end portion of the first semiconductor layer.

8. The semiconductor device according to claim 1, wherein the first semiconductor layer comprises germanium or silicon.

9. The semiconductor device according to claim 1, wherein the second semiconductor layer comprises germanium or silicon.

10. A semiconductor device comprising:
    a gate electrode layer and a first semiconductor layer comprising crystalline semiconductor over an insulating surface;
    a second semiconductor layer provided on and in contact with the first semiconductor layer;
    a gate insulating layer provided between the gate electrode layer and the first semiconductor layer;
    a first impurity semiconductor layer and a second impurity semiconductor layer, the first impurity semiconductor layer and the second impurity semiconductor layer being provided in contact with the second semiconductor layer and separated from each other;
    a first conductive layer electrically connected to the first impurity semiconductor layer; and
    a second conductive layer electrically connected to the second impurity semiconductor layer,
    wherein an end portion of the first semiconductor layer is positioned inside the second semiconductor layer so that the first semiconductor layer is not in contact with any of the first conductive layer and the second conductive layer, and wherein a first space section is defined by an opening formed by the end portion of the first semiconductor layer, the second semiconductor layer, the first conductive layer, and the gate insulating layer.

11. The semiconductor device according to claim 10, wherein the first semiconductor layer has a higher carrier mobility than the second semiconductor layer.

12. An electronic appliance comprising the semiconductor device according to claim 10.

13. The semiconductor device according to claim 10, wherein the second semiconductor layer comprising an amorphous semiconductor.

14. The semiconductor device according to claim 10, wherein the first semiconductor layer comprises germanium or silicon.

15. The semiconductor device according to claim 10, wherein the second semiconductor layer comprises germanium or silicon.

* * * * *

UNITED STATES PATENT AND TRADEMARK OFFICE
CERTIFICATE OF CORRECTION

PATENT NO. : 8,629,445 B2
APPLICATION NO. : 13/397705
DATED : January 14, 2014
INVENTOR(S) : Tanaka et al.

It is certified that error appears in the above-identified patent and that said Letters Patent is hereby corrected as shown below:

In the Specification:

Col. 3, line 36, "appliance Including the above" should read --appliance including the above--

Col. 5, line 7, "schematic fop view of a" should read --schematic top view of a--

Col. 5, line 37, "silicon germanium, of the like" should read --silicon germanium, or the like--

Col. 6, line 4, "a stacked, structure including" should read --a stacked structure including--

Col. 6, line 6, "can be, used. Further," should read --can be used. Further,--

Col. 6, line 33, "a silicon nitride oxide; film," should read --a silicon nitride oxide film,--

Col. 6, line 45, "are; performed using Rutherford" should read --are performed using Rutherford--

Col. 6, line 49, "ranging from 5.0 at. % to 70" should read --ranging from 50 at. % to 70--

Col. 8, line 53, "so that carriers can; flow" should read --so that carriers can flow--

Col. 9, line 13, "using ah amorphous semiconductor" should read --using an amorphous semiconductor--

Col. 9, line 57, "containing, 2.38 wt % of" should read --containing 2.38 wt % of--

Col. 11, line 4, "overlap with any of die" should read --overlap with any of the--

Col. 11, line 9, "In the transistor 166" should read --In the transistor 100--

Col. 11, line 14, "layer 109 is hot in contact" should read --layer 109 is not in contact--

Col. 12, line 14, "so that the First semiconductor-layer 171" should read --so that the first semiconductor layer 171--

Signed and Sealed this
Twenty-third Day of September, 2014

Michelle K. Lee
*Deputy Director of the United States Patent and Trademark Office*

CERTIFICATE OF CORRECTION (continued)
U.S. Pat. No. 8,629,445 B2

In the Specification:

Col. 12, line 39, "not in contact with arty of the" should read --not in contact with any of the--

Col. 17, line 14, "such as ah organic" should read --such as an organic--

Col. 17, line 23, "In this case, the hinge," should read --In this case, the hinge--

Col. 17, line 24, "display is, not performed" should read --display is not performed--

Col. 18, line 26, "the pressure was 1.237 Pa;" should read --the pressure was 1237 Pa;--

Col. 18, line 64, "formed, then, the resist" should read --formed. Then, the resist--

Col. 19, line 3, "Lastly as a protective film" should read --Lastly, as a protective film,--